United States Patent
Li

(10) Patent No.: US 12,308,943 B2
(45) Date of Patent: May 20, 2025

(54) METHOD AND APPARATUS FOR RECEIVING ANALOG SIGNAL

(71) Applicant: BEIJING XIAOMI MOBILE SOFTWARE CO., LTD., Beijing (CN)

(72) Inventor: Yuanyuan Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 169 days.

(21) Appl. No.: 17/293,470

(22) PCT Filed: Nov. 15, 2018

(86) PCT No.: PCT/CN2018/115730
§ 371 (c)(1),
(2) Date: May 12, 2021

(87) PCT Pub. No.: WO2020/097882
PCT Pub. Date: May 22, 2020

(65) Prior Publication Data
US 2022/0131604 A1    Apr. 28, 2022

(51) Int. Cl.
*H04B 7/26*    (2006.01)
*H04L 5/00*    (2006.01)

(52) U.S. Cl.
CPC ......... *H04B 7/2643* (2013.01); *H04L 5/0051* (2013.01)

(58) Field of Classification Search
CPC ............................ H04B 7/2643; H04L 5/0051
See application file for complete search history.

(56) References Cited

U.S. PATENT DOCUMENTS 6,563,891 B1    5/2003    Eriksson et al.
7,039,379 B2    5/2006    Khawand et al.
(Continued)

FOREIGN PATENT DOCUMENTS

CN    1771677 A    5/2006
CN    102088426 A    6/2011
(Continued)

OTHER PUBLICATIONS

Notice of Allowance issued to Chinese Application No. 201880002519.X dated Apr. 27, 2021 with English translation, (6p).
(Continued)

*Primary Examiner* — Joseph A Bednash
(74) *Attorney, Agent, or Firm* — Arch & Lake LLP; Hao Tan; Shen Wang

(57) ABSTRACT

A method, apparatus, and a non-transitory computer-readable storage medium for receiving an analog signal are provided. The method may include determining a first automatic gain factor of a control channel in one time slot. The method may further include receiving, according to said first automatic gain factor, a first analog signal of a control channel sent by a same user equipment in one time slot. The method may further include determining a second automatic gain factor of a traffic channel in one time slot. The control channel and the traffic channel are time-division multiplexed. The method may further include receiving, according to the second automatic gain factor, a second analog signal of the traffic channel sent by the same user equipment in one time slot.

9 Claims, 7 Drawing Sheets

(56) References Cited

U.S. PATENT DOCUMENTS

| | | | |
|---|---|---|---|
| 2002/0048267 A1 | 4/2002 | Jacques et al. | |
| 2006/0217088 A1 | 9/2006 | Nagaoka et al. | |
| 2010/0087202 A1 | 4/2010 | Ventola et al. | |
| 2016/0278003 A1* | 9/2016 | Kim | H04W 72/0446 |
| 2019/0069200 A1* | 2/2019 | Zhang | H04L 5/0053 |
| 2020/0100230 A1* | 3/2020 | Lee | H04L 5/06 |
| 2021/0112505 A1* | 4/2021 | Li | H04L 27/2607 |
| 2021/0258923 A1* | 8/2021 | Kakishima | H04W 56/005 |
| 2021/0352597 A1* | 11/2021 | Do | H04W 72/0446 |

FOREIGN PATENT DOCUMENTS

| | | |
|---|---|---|
| CN | 105101382 A | 11/2015 |
| WO | 2016144489 A1 | 9/2016 |
| WO | 2018203738 A1 | 11/2018 |
| WO | WO-2020142987 A1 * | 7/2020 |

OTHER PUBLICATIONS

Huawei, et al., "Sidelink Physical Layer Structure for NR V2X", Discussion and Decision, 3GPP TSG RAN WG1 Meeting #95, R1-1812206, Spokane, USA, Nov. 12-16, 2018, (12p).

Xiaomi, et al., "Discussion on Physical Layer Structure for NR V2X", Discussion 3GPP TSG RAN WG1 Meeting #95, R1-1813868, Spokane, USA, Nov. 12-26, 2018, (3p).

International Search Report of PCT Application No. PCT/CN2018/115730 dated Aug. 14, 2019, with English translation, (4p).

First Office Action issued in Chinese Application No. 201880002519.X dated Aug. 17, 2020, with English translation, (11p).

Extended European Search Report issued in Application No. 18939871.2, dated Jun. 1, 2022,(9p).

\* cited by examiner

US 12,308,943 B2

METHOD AND APPARATUS FOR RECEIVING ANALOG SIGNAL

CROSS-REFERENCE TO RELATED APPLICATION

The present application is the U.S. national phase of PCT Application No. PCT/CN2018/115730, filed on Nov. 15, 2018, the content of which is incorporated hereby in its entirety for all purposes.

TECHNICAL FIELD

The present application relates to the field of communication technology, and more particularly, to a method and an apparatus for receiving an analog signal.

BACKGROUND

In related technologies, Internet of Vehicles is a new type of Internet. The Internet of Vehicles includes communication between on-board equipment, communication between on-board equipment and roadside equipment, and communication between on-board equipment and handheld equipment. These communications can be direct interconnecting communication, or can be transferred through a base station and a core network. Due to the limitations of the components on a radio frequency side of the equipment, when the received power changes drastically, an Automatic Gain Control (AGC) of a radio frequency amplifier needs to be adjusted. In NR (New Air Interface)-V2X (Vehicle to Everything) system, a multiplexing mode of a control channel and a traffic channel can be Time Division Multiplexing (TDM). How to adjust the AGC under a TDM multiplexing mode and a cross-carrier scheduling mode, and what kind of AGC should be used to receive analog signals of the control channel and the traffic channel, there is no effective solution yet.

SUMMARY

Examples of the present disclosure provide methods and apparatus for receiving an analog signal.

According to a first aspect of the present disclosure, there is provided a method for receiving an analog signal. The method may include determining a first automatic gain factor of a control channel in one time slot. The method may further include receiving, according to the first automatic gain factor, a first analog signal of the control channel sent by a same user equipment in one time slot. The method may further include determining a second automatic gain factor of a traffic channel in one time slot. The control channel and the traffic channel are time-division multiplexed. The method may further include receiving, according to the second automatic gain factor, a second analog signal of the traffic channel sent by the same user equipment in one time slot.

According to a second aspect of the present disclosure, a computing device is provided. The computing device may include one or more processors, a non-transitory computer-readable memory storing instructions executable by the one or more processors. The one or more processors may be configured to determine a first automatic gain factor of a control channel in one time slot. The one or more processors may further be configured to receive, according to the first automatic gain factor, a first analog signal of the control channel sent by a same user equipment in one time slot. The one or more processors may further be configured to determine a second automatic gain factor of a traffic channel in one time slot. The control channel and the traffic channel are time-division multiplexed. The one or more processors may further be configured to receive, according to the second automatic gain factor, a second analog signal of the traffic channel sent by the same user equipment in one time slot.

It should be understood that the above general description and the following detailed description are only exemplary and explanatory, and cannot limit the present invention.

BRIEF DESCRIPTION OF THE DRAWINGS

The drawings here are incorporated into the specification and constitute a part of the specification, show embodiments in accordance with the present disclosure and together with the specification are used to explain the principle of the present disclosure.

DETAILED DESCRIPTION

The exemplary embodiments will be described in detail here, and examples thereof are shown in the accompanying drawings. When the following description refers to the drawings, unless otherwise indicated, the same numbers in different drawings indicate the same or similar elements. The implementations described in the following exemplary embodiments do not represent all implementation consistent with the present disclosure. On the contrary, they are merely examples of apparatus and methods consistent with some aspects of the present disclosure detailed in the appended claims.

Among related technologies, in the Internet of Vehicles of Long Term Evolution (LTE), a control channel and a traffic channel are frequency-division multiplexed, so the control channel and the traffic channel respectively determine their own automatic gain factors. However, in Internet of Vehicles of NR in the 5G (5th generation mobile communication system), the control channel and the traffic channel are time-division multiplexed. At this time, how to determine automatic gain factors of the control channel and the traffic channel to receive analog signals of the control channel and the traffic channel. There is no effective solution yet.

To solve the above-mentioned problem, this embodiment provides a solution for determining automatic gain factors of the control channel and the traffic channel in the time-division multiplexing system, and receiving analog signals according to the automatic gain factors.

Figure 1:
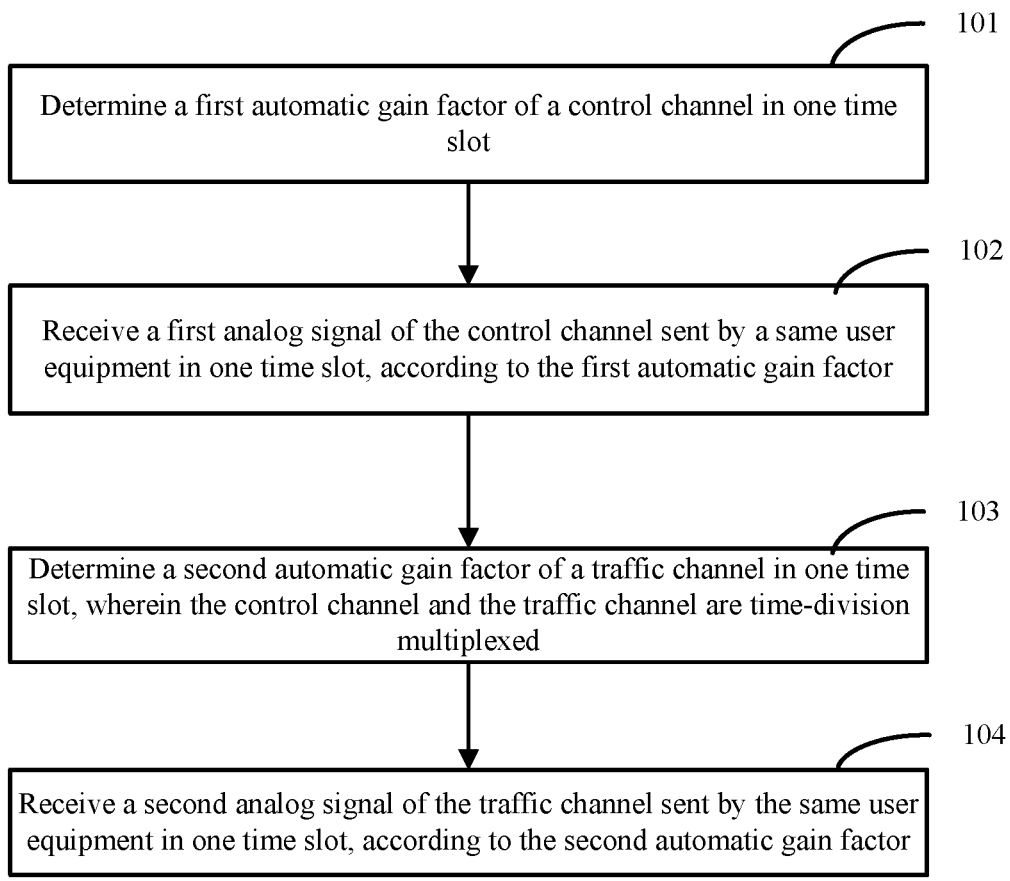
FIG. 1 is a flow chart showing a method for receiving an analog signal according to an exemplary embodiment.

FIG. 1 is a flow chart showing a method for receiving an analog signal according to an exemplary embodiment. The method for receiving the analog signal is used in user equipment. The user equipment may be a mobile phone, a computer, a digital broadcasting terminal, or message transceiving equipment, a game console, a tablet device, medical equipment, fitness equipment, a personal digital assistant, etc. As shown in FIG. 1, the method includes the following steps 101-104.

In step 101, a first automatic gain factor of a control channel in one time slot is determined.

In step 102, a first analog signal of the control channel sent by a same user equipment in one time slot is received according to the first automatic gain factor.

In step 103, a second automatic gain factor of a traffic channel in one time slot is determined; wherein the control channel and the traffic channel are time-division multiplexed.

In step 104, a second analog signal of the traffic channel sent by the same user equipment in one time slot is received according to the second automatic gain factor.

This embodiment may be implemented by user equipment in the Internet of Vehicles. The user equipment may be on-board equipment, or it may be roadside equipment or handheld equipment. The received analog signal can come from other user equipment, or it may come from a base station on the network side, etc.

In this embodiment, the user equipment receives the first analog signal of the control channel of x microseconds (such as 10-14 microseconds) according to an original automatic gain factor, inputs the first analog signal of x microseconds to an AGC module inside the user equipment to calculate the first automatic gain factor, and then uses the calculated first automatic gain factor to continue receiving the first analog signal of the control channel.

Similarly, the user equipment receives the second analog signal of the traffic channel of x microseconds (such as 10-14 microseconds) according to the original automatic gain factor, inputs the second analog signal of x microseconds to the AGC module inside the user equipment to calculate the second automatic gain factor, and then uses the calculated second automatic gain factor to continue receiving the second analog signal of the traffic channel.

The control channel and the traffic channel in this embodiment may come from the same user equipment or may come from different user equipment. The control channel and the traffic channel may be located in the same time slot or in different time slots. For these different cases, the first automatic gain factor of the control channel and the second automatic gain factor of the traffic channel can be respectively determined.

The control channel in this embodiment may be Physical Sidelink Control Channel (PSCCH), and the traffic channel may be Physical Sidelink Discovery Channel (PSDCH).

In an embodiment, when the user equipment that transmits the control channel and the user equipment that transmits the traffic channel are the same user equipment, the second automatic gain factor adopts the first automatic gain factor.

In this embodiment, if the control channel and the traffic channel are come from the same user equipment, the transmission power will not change greatly, so the same automatic gain factor can be used to receive the first analog signal and the second analog signal, that is, the second automatic gain factor adopts the first automatic gain factor.

In this way, the quality of the received analog signal can be basically guaranteed while reducing the adjustment for the automatic gain factor. It can not only save the power consumption of the user equipment, but also reduce the influence of the adjustment of the automatic gain factor on the received analog signal.

In an embodiment, when user equipment that transmits the control channel and user equipment that transmits the traffic channel are the same user equipment, the control channel and the traffic channel may located in the same time slot or may located in different time slots.

In this embodiment, if the user equipment transmitting the first analog signal and the user equipment transmitting the second analog signal are the same user equipment, then the control channel and the traffic channel are located in the same time slot or in different time slots. Whether the control channel and the traffic channel are in the same time slot can be specified by the system or scheduled by the user equipment at a transmitting end.

In this embodiment, if the user equipment which transmits the first analog signal and the user equipment which transmits the second analog signal are the same user equipment, then the second automatic gain factor can be the first automatic gain factor regardless of whether the control channel and the traffic channel belong to the same time slot. Since the transmitting power of the same user equipment does not change greatly, the same automatic gain factor can be used to receive the first analog signal and the second analog signal, that is, the second automatic gain factor adopts the first automatic gain factor.

In an embodiment, when the user equipment that transmits the control channel and the user equipment that transmits the traffic channel are the same user equipment, the method further includes step A1-step A2.

In step A1, it is judged whether a difference between a time-domain position of the control channel and a time-domain position of the traffic channel is less than a preset duration threshold.

In step A2, when the difference is less than the preset duration threshold, the second automatic gain factor adopts the first automatic gain factor.

In response to the difference is not less than the preset duration threshold, the second automatic gain factor does not adopt the first automatic gain factor. The second automatic gain factor can be determined separately according to the aforementioned method.

The duration threshold in this embodiment may be a length of several time-domain symbols (for example, 7 time-domain symbols), or a length of several time slots (for example, 3 time slots).

When judging whether the difference between the time-domain position of the control channel and the time-domain position of the traffic channel is less than the preset duration threshold, the time-domain position of the control channel can be a time-domain position where the control channel ends, and the time-domain position of the traffic channel can be a time-domain position where the traffic channel starts. Alternatively, the time-domain position of the control channel may be a time-domain position of the start of the control channel, and at this time the duration threshold may be configured to be slightly larger.

If the time-domain position of the control channel and the time-domain position of the traffic channel are fixedly configured, the user equipment at the receiving end may know the time-domain position of the control channel and the time-domain position of the traffic channel in advance, and therefore know the difference between the time-domain position of the control channel and the time-domain position of the traffic channel in advance. If the time-domain position of the control channel and the time-domain position of the traffic channel are not fixedly configured, then the user equipment at the receiving end can know the time-domain position of the control channel and the time-domain position of the traffic channel when it just receives the second analog signal of the traffic channel. Thus, the difference between the time-domain position of the control channel and the time-domain position of the traffic channel can be known in advance. After determining the second automatic gain factor, continue to receive the second analog signal of the traffic channel according to the second automatic gain factor.

In this embodiment, the duration threshold is used to control the distance between the control channel and the traffic channel. When the difference between the time-domain position of the control channel and the time-domain position of the traffic channel is less than the preset duration threshold, it is determined that the distance between the control channel and the traffic channel is relatively small, and the transmission power will not change much. Therefore, the second automatic gain factor may adopt the first automatic gain factor. When the difference is not less than the preset duration threshold, it is determined that the distance between the control channel and the traffic channel is relatively large, and the transmission power may vary greatly. Therefore, the second automatic gain factor is not suitable to adopt the first automatic gain factor.

Whether the user equipment at the receiving end needs to go through the judging process of step A1 can be configured by the network side. The network side may send a Radio Resource Control (RRC) signaling or a physical layer signaling to the user equipment to notify the user equipment whether to go through this judging step.

In an embodiment, the method further includes step B.

In step B, it is judged whether the user equipment that transmits the control channel and the user equipment that transmits the traffic channel are the same user equipment.

In this embodiment, if the user equipment transmitting the first analog signal and the user equipment transmitting the second analog signal are the same user equipment, the second automatic gain factor can be or adopt the first automatic gain factor regardless of whether the control channel and the traffic channel belong to the same time slot. Therefore, it is necessary to judge in advance whether the user equipment that transmits the control channel and the user equipment that transmits the traffic channel are the same user equipment. If the user equipment that transmits the first analog signal and the user equipment that transmits the second analog signal are the same user equipment, then the second automatic gain factor may adopt the first automatic gain factor. If the user equipment that transmits the first analog signal and the user equipment that transmits the second analog signal are not the same user equipment, the second automatic gain factor may not be or adopt the first automatic gain factor.

In one embodiment, the step B includes step B1, step B2 or step B3.

In step B1, whether the user equipment that transmits the control channel and the user equipment that transmits the traffic channel are the same user equipment is determined according to pre-configured time-domain positions of the control channel and the traffic channel sent by the same user equipment.

In this embodiment, time-domain positions of the control channel and the traffic channel corresponding to the same user equipment are pre-configured, and the control channel and the traffic channel transmitted at these time-domain positions belong to the same user equipment. Therefore, the user equipment at the receiving end can determine whether the control channel and the traffic channel belong to the user equipment at the same transmitting end via these time domain positions.

In step B2, it is judged whether a first pilot symbol of the control channel and a second pilot symbol of the traffic channel satisfy pre-configured pilot symbols corresponding to the same user equipment.

In this embodiment, the control channel and the traffic channel each carries a respective pilot symbol, that is, the first pilot symbol and the second pilot symbol. A set of first pilot symbol and second pilot symbol corresponding to the same user equipment is preconfigured. When receiving the control channel and the traffic channel, the user equipment at the receiving end first receives and parses the first pilot symbol and the second pilot symbol, and judges whether the first pilot symbol and the second pilot symbol satisfy the pre-configured set of first pilot symbol and second pilot symbol corresponding to same user equipment. If it is satisfied, it is determined that the control channel and the traffic channel belong to the user equipment of the same transmitting end. If it is not satisfied, it is determined that the control channel and the traffic channel do not belong to the user equipment of the same transmitting end.

The first pilot symbol and the second pilot symbol in the pre-configured set of first pilot symbol and second pilot symbol corresponding to same user equipment may be the same or different.

In step B3, the control channel is parsed to obtain control information in the control channel; a traffic channel scheduled by the control channel is determined according to the control information in the control channel; wherein the control channel and the traffic channel scheduled by the control channel belong to the same user equipment.

In this embodiment, the user equipment at the receiving end can quickly receive and parse the control channel, and determine the traffic channel scheduled by the control channel based on the control information in the control channel. The scheduled traffic channel must come from the same user equipment as the control channel. This embodiment is suitable for user equipment with strong hardware processing capabilities, since the user equipment needs to parse out the control information in the control channel before receiving the traffic channel.

Whether the user equipment that transmits the control channel and the user equipment that transmits the traffic channel are the same user equipment can be determined by using one of the above methods. Of course, the foregoing multiple methods can also be used to determine whether the user equipment that transmits the control channel and the user equipment that transmits the traffic channel are the same user equipment.

In the above method, the time-domain positions of the control channel and the traffic channel corresponding to the same user equipment can be pre-configured, or the set of pilot symbols corresponding to the same user equipment can be pre-configured. The configuration information can be sent to the user equipment by base stations or other devices on the network side. The base station may send the above configuration information to the user equipment by sending RRC signaling or physical layer signaling.

The implementation process will be described in detail through several embodiments.

Figure 2:
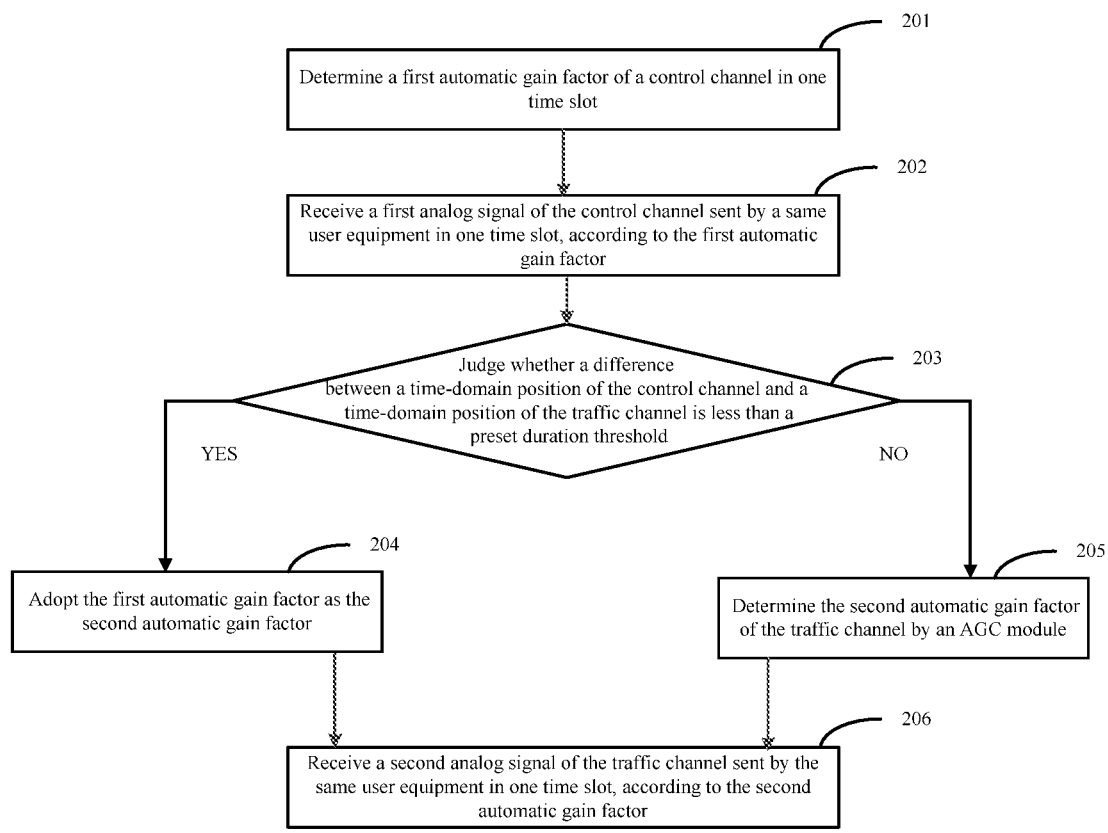
FIG. 2 is a flow chart showing a method for receiving an analog signal according to an exemplary embodiment.

FIG. 2 is a flow chart showing a method for receiving an analog signal according to an exemplary embodiment. The method for receiving the analog signal is used in user equipment. The user equipment may be a mobile phone, a computer, a digital broadcasting terminal, or message transceiving equipment, a game console, a tablet device, medical equipment, fitness equipment, a personal digital assistant, etc. As shown in FIG. 2, the method includes the following steps 201-206.

In step 201, a first automatic gain factor of a control channel in one time slot is determined.

In step 202, a first analog signal of the control channel sent by a same user equipment in one time slot is received according to the first automatic gain factor.

In step 203, it is judged whether a difference between a time-domain position of the control channel and a time-domain position of a traffic channel is less than a preset duration threshold. When the difference is less than the preset duration threshold, proceed to step 204; when the difference is not less than the preset duration threshold, proceed to step 205.

In step 204, the first automatic gain factor is adopted as a second automatic gain factor of the traffic channel.

In step 205, the second automatic gain factor of the traffic channel is determined by an Automatic Gain Control (AGC) module; wherein the control channel and the traffic channel are time-division multiplexed.

In step 206, a second analog signal of the traffic channel sent by the same user equipment in one time slot is received according to the second automatic gain factor.

Figure 3:
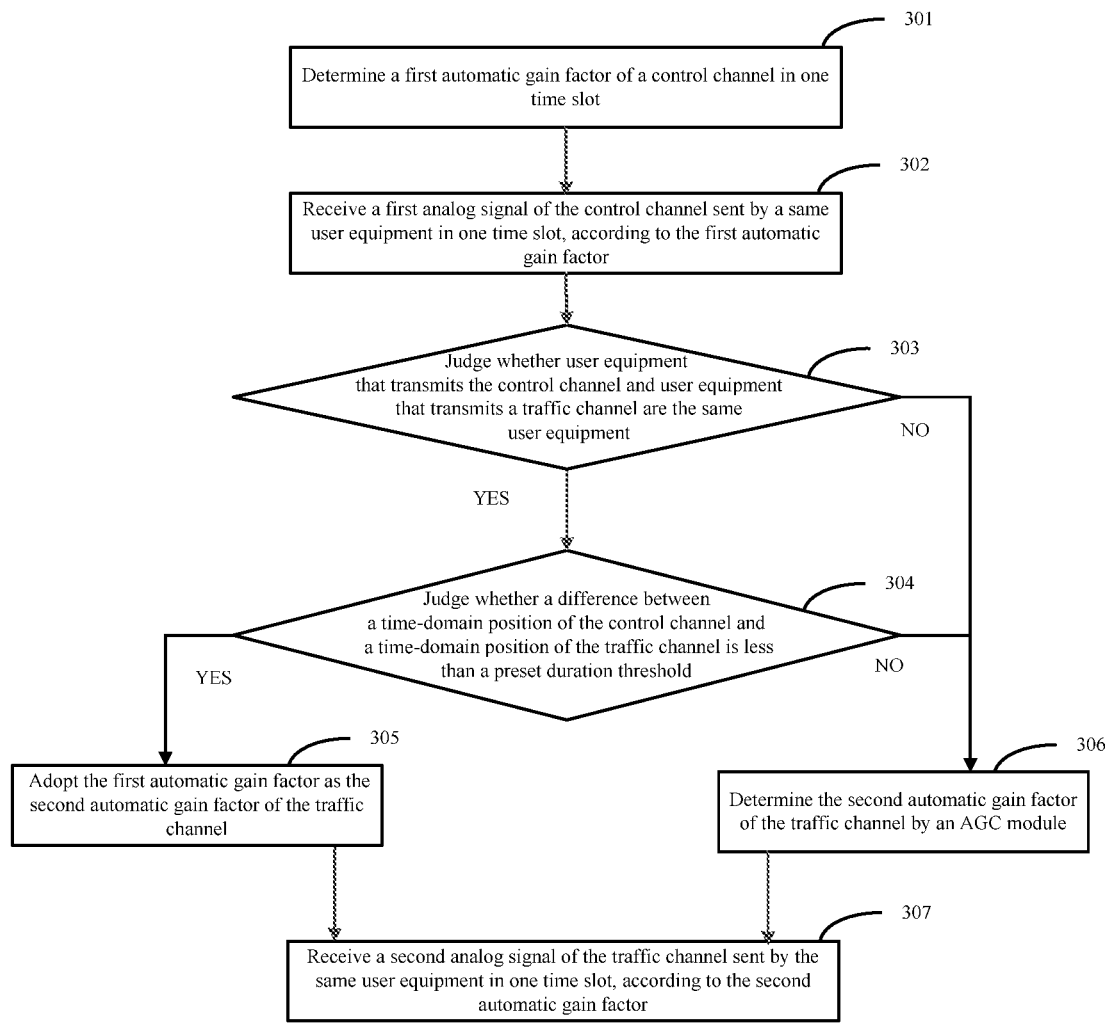
FIG. 3 is a flow chart showing a method for receiving an analog signal according to an exemplary embodiment.

FIG. 3 is a flow chart showing a method for receiving an analog signal according to an exemplary embodiment. The method for receiving an analog signal is used in user equipment. The user equipment may be a mobile phone, a computer, a digital broadcasting terminal, message transceiving equipment, a game console, a tablet device, medical equipment, fitness equipment, a personal digital assistant, etc. As shown in FIG. 3, the method includes the following steps 301-307.

In step 301, a first automatic gain factor of a control channel in one time slot is determined.

In step 302, a first analog signal of the control channel sent by a same user equipment in one time slot is received according to the first automatic gain factor.

In step 303, whether user equipment that transmits the control channel and user equipment that transmits a traffic channel are the same user equipment is judged. If it is the same user equipment, proceed to step 304; if it is not the same user equipment, proceed to step 306.

In step 304, it is judged whether a difference between a time-domain position of the control channel and a time-domain position of the traffic channel is less than a preset duration threshold. When the difference is less than the preset duration threshold, proceed to step 305; when the difference is not less than the preset duration threshold, proceed to step 306.

In step 305, the first automatic gain factor is adopted as a second automatic gain factor of the traffic channel.

In step 306, the second automatic gain factor of the traffic channel is determined by an Automatic Gain Control (AGC) module; wherein the control channel and the traffic channel are time-division multiplexed.

In step 307, a second analog signal of the traffic channel sent by the same user equipment in one time slot is received according to the second automatic gain factor.

The above embodiments can be freely combined according to actual needs.

The following are apparatus embodiments of the present disclosure, which can be used to implement the method embodiments of the present disclosure.

Figure 4:
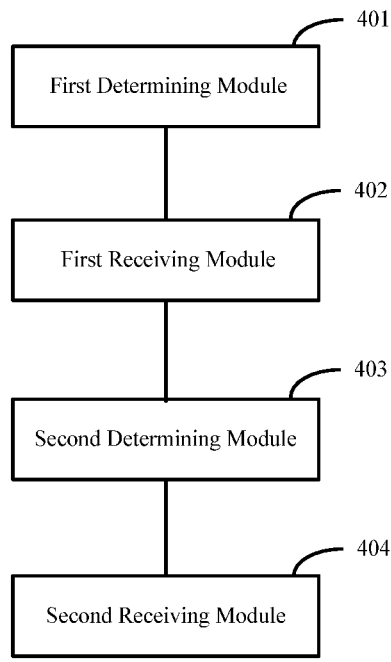
FIG. 4 is a block diagram showing an apparatus for receiving an analog signal according to an exemplary embodiment.

FIG. 4 is a block diagram showing an apparatus for receiving an analog signal according to an exemplary embodiment. The apparatus can be implemented as part or all of an electronic device through software, hardware, or a combination of both. Referring to FIG. 4, the apparatus for receiving an analog signal includes a first determining module 401, a first receiving module 402, a second determining module 403, and a second receiving module 404.

The first determining module 401 is configured to determine a first automatic gain factor of a control channel in one time slot.

The first receiving module 402 is configured to receive a first analog signal of the control channel sent by a same user equipment in one time slot, according to the first automatic gain factor.

The second determining module 403 is configured to determine a second automatic gain factor of a traffic channel in one time slot, wherein the control channel and the traffic channel are time-division multiplexed.

The second receiving module 404 is configured to receive a second analog signal of the traffic channel sent by the same user equipment in one time slot, according to the second automatic gain factor.

In an embodiment, when user equipment that transmits the control channel and user equipment that transmits the traffic channel are the same user equipment, the second automatic gain factor adopts the first automatic gain factor.

In an embodiment, when user equipment that transmits the control channel and user equipment that transmits the traffic channel are the same user equipment, the control channel and the traffic channel are located in a same time slot or located in different time slots.

Figure 5:
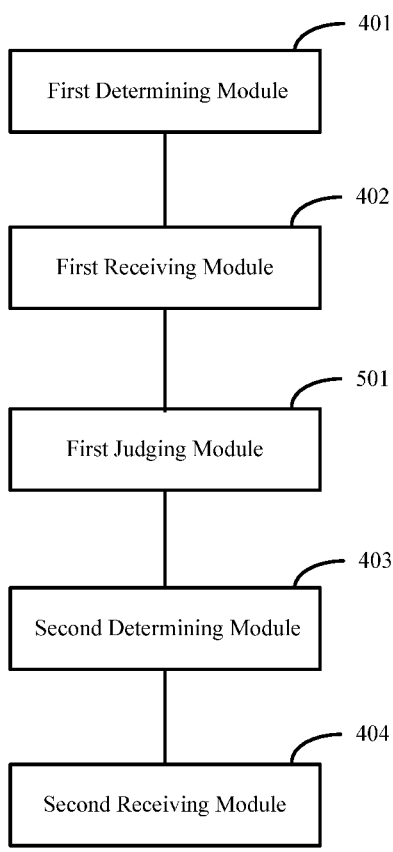
FIG. 5 is a block diagram showing an apparatus for receiving an analog signal according to an exemplary embodiment.

In an embodiment, when the user equipment that transmits the control channel and the user equipment that transmits the traffic channel are the same user equipment, as shown in FIG. 5, the apparatus further includes a first judging module 501.

The first judging module 501 is configured to determine whether the difference between the time domain position of the control channel and the time domain position of the traffic channel is less than a preset duration threshold.

The second determining module 403 is configured to adopt the first automatic gain factor as the second automatic gain factor, when the difference is less than the preset duration threshold.

Figure 6:
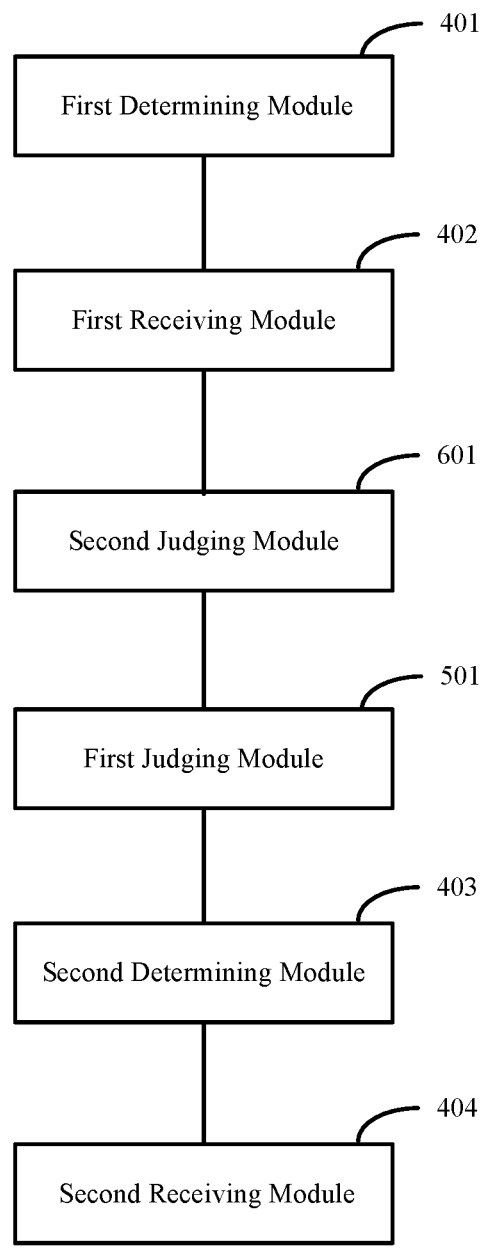
FIG. 6 is a block diagram showing an apparatus for receiving an analog signal according to an exemplary embodiment.

In an embodiment, as shown in FIG. 6, the apparatus further includes a second judging module 601.

The second judging module 601 is configured to judge whether user equipment that transmits the control channel and user equipment that transmits the traffic channel are the same user equipment.

Figure 7:
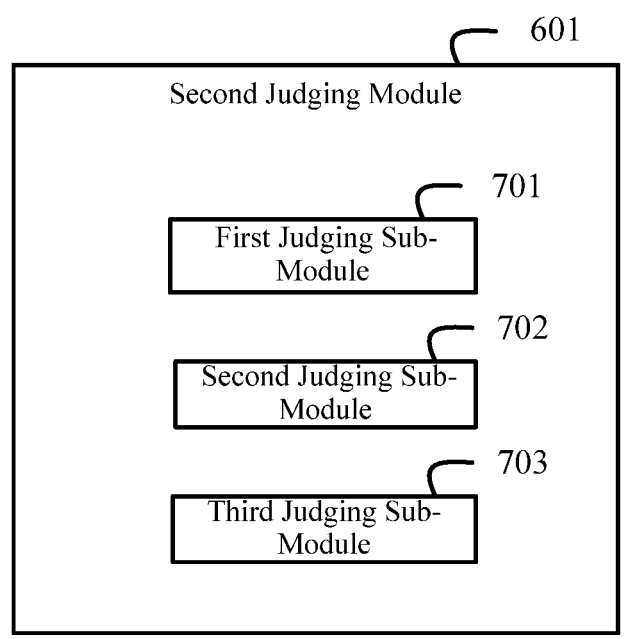
FIG. 7 a block diagram showing a second judging module according to an exemplary embodiment.

In one embodiment, as shown in FIG. 7, the second judging module 601 includes a first judging sub-module 701, a second judging sub-module 702 or a third judging sub-module 703.

The first judging sub-module 701 is configured to determine whether user equipment that transmits the control channel and user equipment that transmits the traffic channel are the same user equipment, according to pre-configured time-domain positions of the control channel and the traffic channel sent by the same user equipment.

The second judging sub-module 702 is configured to judge whether a first pilot symbol of the control channel and a second pilot symbol of the traffic channel satisfy preconfigured pilot symbols corresponding to the same user equipment.

The third judging sub-module 703 is configured to parse the control channel to obtain control information in the control channel; determine a traffic channel scheduled by the control channel according to the control information in the control channel; wherein the control channel and the traffic channel scheduled by the control channel belong to the same user equipment.

Regarding the apparatus in the foregoing embodiment, the specific manner in which each module performs operation has been described in detail in the embodiment of the method, and detailed description will not be given here.

Figure 8:
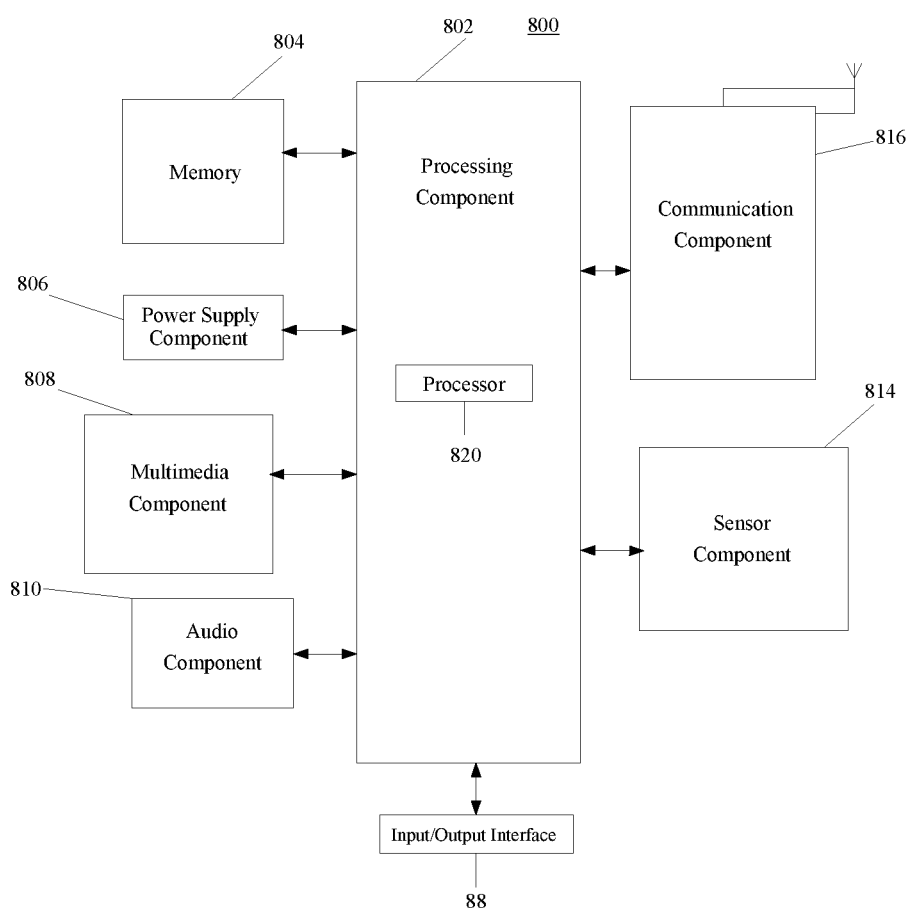
FIG. 8 is a block diagram showing a device suitable for receiving an analog signal according to an exemplary embodiment.

FIG. 8 is a block diagram showing a device for receiving an analog signal according to an exemplary embodiment. For example, the device 800 may be a mobile phone, a computer, a digital broadcasting terminal, a message transceiving device, a game console, a tablet device, medical equipment, a fitness equipment, a personal digital assistant, etc.

The device 800 may include one or more of the following components: a processing component 802, a memory 804, a power supply component 806, a multimedia component 808, an audio component 810, an input/output (I/O) interface 88, a sensor component 814, and a communication component 816

The processing component 802 generally controls the overall operations of the device 800, such as operations associated with displaying, telephone calls, data communication, camera operations, and recording operations. The processing component 802 may include one or more processors 820 to execute instructions to complete all or part of the steps in the above method. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 is configured to store various types of data to support operations at the device 800. Examples of these data include instructions for any application or method operating on the device 800, contact data, phone book data, messages, pictures, videos, and so on. The memory 804 may be implemented by any type of volatile or non-volatile storage device or a combination thereof, such as static random access memory (SRAM), electrically erasable programmable read only memory (EEPROM), erasable programmable read only memory (EPROM), programmable read only memory (PROM), read only memory (ROM), magnetic memory, flash memory, magnetic disk or optical disk.

The power supply component 806 provides power to various components of the device 800. The power supply component 806 may include a power supply management system, one or more power supplies, and other components associated with generating, managing, and distributing power for the device 800.

The multimedia component 808 includes a screen that provides an output interface between the device 800 and the user. In some embodiments, the screen may include a liquid crystal display (LCD) and a touch panel (TP). If the screen includes a touch panel, then the screen may be implemented as a touch screen to receive input signals from the user. The touch panel includes one or more touch sensors, to sense touching, swiping, and gestures on the touch panel. The touch sensor may not only sense a boundary of the touching operation or swiping operation, but also detect a duration and pressure related to the touching operation or swiping operation. In some embodiments, the multimedia component 808 includes a front camera and/or a rear camera. When the device 800 is in an operation mode, such as a shooting mode or a video mode, the front camera and/or the rear camera may receive external multimedia data. Each of the front camera and rear camera may be a fixed optical lens system or have focal length and optical zoom capabilities.

The audio component 810 is configured to output and/or input audio signals. For example, the audio component 810 includes a microphone (MIC). When the device 800 is in an operation mode, such as a call mode, a recording mode, and a voice recognition mode, the microphone is configured to receive an external audio signal. The received audio signal may be further stored in the memory 804 or sent via the communication component 816. In some embodiments, the audio component 810 further includes a speaker for outputting audio signals.

The I/O interface 88 provides an interface between the processing component 802 and a peripheral interface module. The peripheral interface module may be a keyboard, a click wheel, a button and so on. These buttons may include, but are not limited to: home button, volume button, start button, and lock button.

The sensor assembly 814 includes one or more sensors for providing the status assessment of various aspects for the device 800. For example, the sensor component 814 can detect the on/off state of the device 800, and the relative positioning of the components, for example, the component is a display and a keypad of the device 800, and the sensor component 814 can also detect the position change of the device 800 or a component of the device 800, the presence or absence of user contact with the device 800, the orientation or acceleration/deceleration of the device 800, and the temperature change of the device 800. The sensor assembly 814 may include a proximity sensor configured to detect the presence of nearby objects without any physical contact. The sensor assembly 814 may also include a light sensor, such as a CMOS or CCD image sensor, for use in imaging applications. In some embodiments, the sensor assembly 814 may also include an acceleration sensor, a gyro sensor, a magnetic sensor, a pressure sensor, or a temperature sensor.

The communication component 816 is configured to facilitate wired or wireless communication between the device 800 and other devices. The device 800 can access a wireless network based on a communication standard, such as WiFi, 2G, or 3G, or a combination thereof. In an exemplary embodiment, the communication component 816 receives a broadcast signal or broadcast related information from an external broadcast management system via a broadcast channel. In an exemplary embodiment, the communication component 816 further includes a near field communication (NFC) module to facilitate short-range communication. For example, the NFC module can be implemented based on radio frequency identification (RFID) technology, infrared data association (IrDA) technology, ultra-wideband (UWB) technology, Bluetooth (BT) technology and other technologies.

In an exemplary embodiment, the device 800 may be implemented by one or more application specific integrated circuits (ASICs), digital signal processors (DSPs), digital signal processing devices (DSPDs), programmable logic devices (PLDs), Field programmable gate array (FPGA), controller, microcontroller, microprocessor or other electronic components, to execute the receiving method described in any of the above embodiments.

In an exemplary embodiment, there is also provided a non-transitory computer-readable storage medium including instructions, such as a memory 804 including instructions, which can be executed by the processor 820 of the apparatus 800 to complete the above method. For example, the non-transitory computer-readable storage medium may be ROM, random access memory (RAM), CD-ROM, magnetic tape, floppy disk, optical data storage device, or the like.

In an exemplary embodiment, a device for receiving an analog signal is provided, the device includes:
  a processor;
  a memory for storing instructions executable by the processor;
  wherein the processor is configured to:
  determine a first automatic gain factor of a control channel in one time slot;
  receive a first analog signal of the control channel sent by a same user equipment in one time slot, according to the first automatic gain factor;
    determine a second automatic gain factor of a traffic channel in one time slot, wherein the control channel and the traffic channel are time-division multiplexed; and
    receive a second analog signal of the traffic channel sent by the same user equipment in one time slot, according to the second automatic gain factor.

The above-mentioned processor may also be configured to: in response to user equipment that transmits the control channel and user equipment that transmits the traffic channel are the same user equipment, the second automatic gain factor adopts the first automatic gain factor.

The above-mentioned processor may also be configured to: in response to user equipment that transmits the control channel and user equipment that transmits the traffic channel are the same user equipment, the control channel and the traffic channel are located in a same time slot or located in different time slots.

In response to user equipment that transmits the control channel and user equipment that transmits the traffic channel are the same user equipment, the above-mentioned processor may also be configured to:
  judge whether a difference between a time-domain position of the control channel and a time-domain position of the traffic channel is less than a preset duration threshold;
  adopt the first automatic gain factor as the second automatic gain factor, when the difference is less than the preset duration threshold.

The above-mentioned processor may also be configured to judge whether user equipment that transmits the control channel and user equipment that transmits the traffic channel are the same user equipment.

The above-mentioned processor may also be configured to:
  according to pre-configured time-domain positions of the control channel and the traffic channel sent by the same user equipment, determine whether user equipment that transmits the control channel and user equipment that transmits the traffic channel are the same user equipment; or
  judge whether a first pilot symbol of the control channel and a second pilot symbol of the traffic channel satisfy pre-configured pilot symbols corresponding to the same user equipment; or
  parse the control channel to obtain control information in the control channel; determining a traffic channel scheduled by the control channel according to the control information in the control channel; wherein the control channel and the traffic channel scheduled by the control channel belong to the same user equipment.

A computer-readable storage medium having computer instructions stored thereon, wherein, when the instructions are executed by a processor, the method for receiving an analog signal mentioned above is implemented by a device, the method includes:
  determining a first automatic gain factor of a control channel in one time slot;
  receiving a first analog signal of the control channel sent by a same user equipment in one time slot, according to the first automatic gain factor;
  determining a second automatic gain factor of a traffic channel in one time slot, wherein the control channel and the traffic channel are time-division multiplexed; and
  receiving a second analog signal of the traffic channel sent by the same user equipment in one time slot, according to the second automatic gain factor.

The instructions in the storage medium may also include instructions for a step of in response to user equipment that transmits the control channel and user equipment that transmits the traffic channel are the same user equipment, the second automatic gain factor adopts the first automatic gain factor.

The instructions in the storage medium may also include instructions for a step of in response to user equipment that transmits the control channel and user equipment that transmits the traffic channel are the same user equipment, the control channel and the traffic channel are located in a same time slot or located in different time slots.

The instructions in the storage medium may also include instructions for followings steps: in response to user equipment that transmits the control channel and user equipment that transmits the traffic channel are the same user equipment, the method comprising:
  judging whether a difference between a time-domain position of the control channel and a time-domain position of the traffic channel is less than a preset duration threshold;
  adopting the first automatic gain factor as the second automatic gain factor, when the difference is less than the preset duration threshold.

The instructions in the storage medium may also include instructions for a step judging whether user equipment that transmits the control channel and user equipment that transmits the traffic channel are the same user equipment.

The instructions in the storage medium may also include instructions for followings steps: said judging whether user equipment that transmits the control channel and user equipment that transmits the traffic channel are the same user equipment comprising:
  according to pre-configured time-domain positions of the control channel and the traffic channel sent by the same user equipment, determining whether user equipment that transmits the control channel and user equipment that transmits the traffic channel are the same user equipment; or
  judging whether a first pilot symbol of the control channel and a second pilot symbol of the traffic channel satisfy pre-configured pilot symbols corresponding to the same user equipment; or
  parsing the control channel to obtain control information in the control channel; determining a traffic channel scheduled by the control channel according to the control information in the control channel; wherein the control channel and the traffic channel scheduled by the control channel belong to the same user equipment.

In the embodiments of the present disclosure, there is provided a method for receiving an analog signal, the method including:

determining a first automatic gain factor of a control channel in one time slot;

receiving a first analog signal of the control channel sent by a same user equipment in one time slot, according to the first automatic gain factor;

determining a second automatic gain factor of a traffic channel in one time slot, wherein the control channel and the traffic channel are time-division multiplexed; and receiving a second analog signal of the traffic channel sent by the same user equipment in one time slot, according to the second automatic gain factor.

The technical solution provided by the embodiment of the present disclosure may include the following beneficial effects: since the control channel and the traffic channel are time-division multiplexed, this embodiment determines the automatic gain factors for each of the control channel and the traffic channel respectively, receive their respective analog signals according to their respective automatic gain factors, thus providing an implementation scheme for receiving analog signals.

In one embodiment, in response to user equipment that transmits the control channel and user equipment that transmits the traffic channel are the same user equipment, the second automatic gain factor adopts the first automatic gain factor.

The technical solution provided by the embodiment of the present disclosure may include the following beneficial effects: this embodiment can apply the first automatic gain factor to the second automatic gain factor, which reduces the process of determining the second automatic gain factor, and facilitates rapid reception of the second analog signal of the traffic channel.

In one embodiment, in response to user equipment that transmits the control channel and user equipment that transmits the traffic channel are the same user equipment, the control channel and the traffic channel are located in a same time slot or located in different time slots.

The technical solution provided by the embodiment of the present disclosure may include the following beneficial effects: this embodiment is suitable for a variety of application scenarios and facilitates flexible configuration of network resources.

In one embodiment, in response to user equipment that transmits the control channel and user equipment that transmits the traffic channel are the same user equipment, the method further includes:

judging whether a difference between a time-domain position of the control channel and a time-domain position of the traffic channel is less than a preset duration threshold;

adopting the first automatic gain factor as the second automatic gain factor, when the difference is less than the preset duration threshold.

The technical solution provided by the embodiment of the present disclosure may include the following beneficial effects: in this embodiment, the distance between the control channel and the traffic channel is controlled by the duration threshold. When the distance is relatively small, the second automatic gain factor may adopt the first automatic gain factor to ensure the quality of the received second analog signal.

In one embodiment, the method further includes judging whether user equipment that transmits the control channel and user equipment that transmits the traffic channel are the same user equipment.

The technical solution provided by the embodiment of the present disclosure may include the following beneficial effects: this embodiment can also judge whether the control channel and the traffic channel belong to the same user equipment.

In one embodiment, said judging whether user equipment that transmits the control channel and user equipment that transmits the traffic channel are the same user equipment includes:

according to pre-configured time-domain positions of the control channel and the traffic channel sent by the same user equipment, determining whether user equipment that transmits the control channel and user equipment that transmits the traffic channel are the same user equipment; or judging whether a first pilot symbol of the control channel and a second pilot symbol of the traffic channel satisfy pre-configured pilot symbols corresponding to the same user equipment; or parsing the control channel to obtain control information in the control channel; determining a traffic channel scheduled by the control channel according to the control information in the control channel; wherein the control channel and the traffic channel scheduled by the control channel belong to the same user equipment.

The technical solution provided by the embodiment of the present disclosure may include the following beneficial effects: this embodiment provides multiple solutions for judging whether the control channel and the traffic channel belong to the same user equipment, which is suitable for multiple application scenarios.

In the embodiments of the present disclosure, there is provided an apparatus for receiving an analog signal. The apparatus may include:

a first determining module configured to determine a first automatic gain factor of a control channel in one time slot;

a first receiving module configured to receive a first analog signal of the control channel sent by a same user equipment in one time slot, according to the first automatic gain factor;

a second determining module configured to determine a second automatic gain factor of a traffic channel in one time slot, wherein the control channel and the traffic channel are time-division multiplexed; and a second receiving module configured to receive a second analog signal of the traffic channel sent by the same user equipment in one time slot, according to the second automatic gain factor.

In one embodiment, in response to user equipment that transmits the control channel and user equipment that transmits the traffic channel are the same user equipment, the second automatic gain factor adopts the first automatic gain factor.

In one embodiment, in response to user equipment that transmits the control channel and user equipment that transmits the traffic channel are the same user equipment, the control channel and the traffic channel are located in a same time slot or located in different time slots.

In one embodiment, in response to user equipment that transmits the control channel and user equipment that transmits the traffic channel are the same user equipment, the apparatus further includes:

a first judging module configured to judge whether a difference between a time-domain position of the control channel and a time-domain position of the traffic channel is less than a preset duration threshold;

the second determining module is configured to adopt the first automatic gain factor as the second automatic gain factor, in response to the difference is less than the preset duration threshold.

In one embodiment, the apparatus further includes a second judging module configured to judge whether user equipment that transmits the control channel and user equipment that transmits the traffic channel are the same user equipment.

In one embodiment, the apparatus further includes a first judging sub-module, a second judging sub-module, or a third judging sub-module, the first judging sub-module is configured to determine whether user equipment that transmits the control channel and user equipment that transmits the traffic channel are the same user equipment, according to pre-configured time-domain positions of the control channel and the traffic channel sent by the same user equipment;

the second judging sub-module is configured to judge whether a first pilot symbol of the control channel and a second pilot symbol of the traffic channel satisfy pre-configured pilot symbols corresponding to the same user equipment;

the third judging sub-module is configured to parse the control channel to obtain control information in the control channel; determine a traffic channel scheduled by the control channel according to the control information in the control channel; wherein the control channel and the traffic channel scheduled by the control channel belong to the same user equipment.

In the embodiments of the present disclosure, there is provided a device for receiving an analog signal. The device may include:

a processor; and a memory for storing instructions executable by the processor;

wherein the processor is configured to:

determine a first automatic gain factor of a control channel in one time slot;

receive a first analog signal of the control channel sent by a same user equipment in one time slot, according to the first automatic gain factor;

determine a second automatic gain factor of a traffic channel in one time slot, wherein the control channel and the traffic channel are time-division multiplexed; and receive a second analog signal of the traffic channel sent by the same user equipment in one time slot, according to the second automatic gain factor.

In the embodiments of the present disclosure, there is provided a computer-readable storage medium having computer instructions stored thereon, wherein, when the instructions are executed by a processor, the methods for receiving the analog signal mentioned above are implemented.

After considering the description and practice of the disclosure disclosed herein, those skilled in the art will easily think of other implementations of the disclosure. The present application is intended to cover any variations, usage, or adaptive changes of the present disclosure that follow the general principles of the present disclosure and include common general knowledge or customary technical means in the technical field not disclosed in the present disclosure. The description and examples are to be considered exemplary only, and the true scope and spirit of this disclosure are pointed out by the following claims.

It should be understood that the present disclosure is not limited to the precise structure that has been described above and shown in the drawings, and various modifications and changes can be made without departing from the scope thereof. The scope of the present disclosure is limited only by the appended claims.

What is claimed is:

1. A method for receiving an analog signal, comprising:
in each time slot:
determining a first automatic gain factor of a control channel, wherein the control channel is Physical Sidelink Control Channel (PSCCH);
receiving, according to the first automatic gain factor, a first analog signal of the control channel sent by user equipment that transmits the control channel;
determining whether the user equipment that transmits the control channel and user equipment that transmits a traffic channel are the same user equipment, wherein the traffic channel is Physical Sidelink Discovery Channel (PSDCH), and the control channel and the traffic channel are time-division multiplexed;
in response to determining the same user equipment transmits the control channel and the traffic channel, determining whether a difference between a time-domain position of the control channel and a time-domain position of the traffic channel is less than a preset duration threshold;
in response to the difference being less than the preset duration threshold, adopting the first automatic gain factor as a second automatic gain factor of the traffic channel; and
in response to the difference being not less than the preset duration threshold, determining the second automatic gain factor of the traffic channel;
in response to determining different user equipment transmits the control channel and the traffic channel, determining the second automatic gain factor of the traffic channel; and
receiving, according to the second automatic gain factor, a second analog signal of the traffic channel sent by the user equipment that transmits the traffic channel;
wherein determining whether user equipment that transmits the control channel and user equipment that transmits the traffic channel are the same user equipment comprises:
determining whether a first pilot symbol of the control channel and a second pilot symbol of the traffic channel satisfy pre-configured pilot symbols corresponding to the same user equipment.

2. The method according to claim 1, further comprising:
locating, in response to user equipment that transmits the control channel and user equipment that transmits the traffic channel being the same user equipment, the control channel and the traffic channel in a same time slot or in different time slots.

3. The method according to claim 1, wherein determining whether user equipment that transmits the control channel and user equipment that transmits the traffic channel are the same user equipment further comprises:
determining, according to pre-configured time-domain positions of the control channel and the traffic channel sent by the same user equipment, whether user equipment that transmits the control channel and user equipment that transmits the traffic channel are the same user equipment;
or determining a traffic channel scheduled by the control channel according to control information in the control channel obtained by parsing the control channel, wherein the control channel and the traffic channel scheduled by the control channel belong to the same user equipment.

4. A device comprising:
one or more processors; and
a non-transitory computer-readable storage medium for storing instructions executable by the one or more processors;
wherein when the instructions are executed by the one or more processors, cause the device to:
in each time slot:
determine a first automatic gain factor of a control channel, wherein the control channel is Physical Sidelink Control Channel (PSCCH);
receive, according to the first automatic gain factor, a first analog signal of the control channel sent by user equipment that transmits the control channel;
determine whether the user equipment that transmits the control channel and user equipment that transmits a traffic channel are the same user equipment, wherein the traffic channel is Physical Sidelink Discovery Channel (PSDCH), and the control channel and the traffic channel are time-division multiplexed;
in response to determining the same user equipment transmits the control channel and the traffic channel, determine whether a difference between a time-domain position of the control channel and a time-domain position of the traffic channel is less than a preset duration threshold;
in response to the difference being less than the preset duration threshold, adopt the first automatic gain factor as a second automatic gain factor of the traffic channel; and
in response to the difference being not less than the preset duration threshold, determine the second automatic gain factor of the traffic channel;
in response to determining different user equipment transmits the control channel and the traffic channel, determine the second automatic gain factor of the traffic channel; and
receive, according to the second automatic gain factor, a second analog signal of the traffic channel sent by the user equipment that transmits the traffic channel;
wherein determining whether user equipment that transmits the control channel and user equipment that transmits the traffic channel are the same user equipment comprises:
determining whether a first pilot symbol of the control channel and a second pilot symbol of the traffic channel satisfy pre-configured pilot symbols corresponding to the same user equipment.

5. The device according to claim 4, wherein the one or more processors are further configured to:
locate, in response to user equipment that transmits the control channel and user equipment that transmits the traffic channel being the same user equipment, the control channel and the traffic channel in a same time slot or in different time slots.

6. The device according to claim 4, wherein the one or more processors are further configured to:
determine, according to pre-configured time-domain positions of the control channel and the traffic channel sent by the same user equipment, whether user equipment that transmits the control channel and user equipment that transmits the traffic channel are the same user equipment;
or
determine a traffic channel scheduled by the control channel according to control information in the control channel obtained by parsing the control channel, wherein the control channel and the traffic channel scheduled by the control channel belong to the same user equipment.

7. A non-transitory computer-readable storage medium storing a plurality of programs for execution by a computing device having one or more processors, wherein the plurality of programs, when executed by the one or more processors, cause the computing device to perform acts comprising a method for receiving an analog signal, the method comprising:
in each time slot:
determining a first automatic gain factor of a control channel, wherein the control channel is Physical Sidelink Control Channel (PSCCH);
receiving, according to the first automatic gain factor, a first analog signal of the control channel sent by user equipment that transmits the control channel;
determining whether the user equipment that transmits the control channel and user equipment that transmits a traffic channel are the same user equipment, wherein the traffic channel is Physical Sidelink Discovery Channel (PSDCH), and the control channel and the traffic channel are time-division multiplexed;
in response to determining the same user equipment transmits the control channel and the traffic channel, determining whether a difference between a time-domain position of the control channel and a time-domain position of the traffic channel is less than a preset duration threshold;
in response to the difference being less than the preset duration threshold, adopting threshold, the first automatic gain factor as a second automatic gain factor of the traffic channel; and
in response to the difference being not less than the preset duration threshold, determining the second automatic gain factor of the traffic channel;
in response to determining different user equipment transmits the control channel and the traffic channel, determining the second automatic gain factor of the traffic channel; and
receiving, according to the second automatic gain factor, a second analog signal of the traffic channel sent by the user equipment that transmits the traffic channel;
wherein determining whether user equipment that transmits the control channel and user equipment that transmits the traffic channel are the same user equipment comprises:
determining whether a first pilot symbol of the control channel and a second pilot symbol of the traffic channel satisfy pre-configured pilot symbols corresponding to the same user equipment.

8. The computer-readable storage medium according to claim 7, wherein the plurality of programs further cause the computing device to perform:
locating, in response to user equipment that transmits the control channel and user equipment that transmits the traffic channel being the same user equipment, the control channel and the traffic channel in a same time slot or in different time slots.

9. The computer-readable storage medium according to claim 7, wherein the plurality of programs further cause the computing device to perform:
- determining, according to pre-configured time-domain positions of the control channel and the traffic channel sent by the same user equipment, whether user equipment that transmits the control channel and user equipment that transmits the traffic channel are the same user equipment;

or

- determining a traffic channel scheduled by the control channel according to control information in the control channel obtained by parsing the control channel; wherein the control channel and the traffic channel scheduled by the control channel belong to the same user equipment.

* * * * *